United States Patent [19]

Andreano et al.

[11] Patent Number: 5,223,788
[45] Date of Patent: Jun. 29, 1993

[54] FUNCTIONAL AVIONIC CORE TESTER

[75] Inventors: Richard J. Andreano, East Northport; Arthur J. Granata, Hicksville; Jeffrey W. Hansen, Medford, all of N.Y.

[73] Assignee: Grumman Aerospace Corporation, Bethpage, N.Y.

[21] Appl. No.: 758,001

[22] Filed: Sep. 12, 1991

[51] Int. Cl.$^5$ .................. G01R 31/02; G01R 31/28
[52] U.S. Cl. ........................... 324/158 R; 324/73.1; 371/15.1
[58] Field of Search ............ 324/158 R, 73.1; 371/15.1, 20.1; 364/481

[56] References Cited

U.S. PATENT DOCUMENTS

| | | | |
|---|---|---|---|
| 4,066,882 | 1/1978 | Esposito | 235/302 |
| 4,316,259 | 2/1982 | Albrecht et al. | 364/718 |
| 4,397,021 | 8/1983 | Lloyd et al. | 371/15.1 |
| 4,402,055 | 8/1983 | Lloyd et al. | 324/73.1 |
| 4,453,229 | 6/1984 | Schaire | 364/900 |
| 4,507,740 | 3/1985 | Star et al. | 364/487 |
| 4,719,459 | 1/1988 | Kovacs et al. | 340/825.8 |
| 4,760,329 | 7/1988 | Andreano | 327/73 R |
| 4,760,330 | 7/1988 | Lias, Jr. | 371/15.1 |
| 4,763,124 | 9/1988 | Kovacs et al. | 340/825.8 |
| 4,791,312 | 12/1988 | Weick | 307/264 |
| 4,792,951 | 12/1988 | Nielsen | 371/27 |
| 4,799,220 | 1/1989 | Nielsen | 371/25 |
| 4,810,958 | 3/1989 | Mogi et al. | 371/15.1 |
| 5,023,791 | 6/1991 | Herzberg et al. | 371/15.1 |
| 5,036,479 | 7/1991 | Prednis et al. | 324/158 R |

OTHER PUBLICATIONS

William A. Bostrom and Henry J. Baluta, "Fast Functional Avionics System Tester," Sep. 17, 1990, Auto Test Con Conference Report, pp. 9–14.
IEEE Standard 716-1989, pp. 13-2 to 13-9.

Primary Examiner—Ernest F. Karlsen
Attorney, Agent, or Firm—Bacon & Thomas

[57] ABSTRACT

A testing system, in particular for weapons and avionics applications, includes a bus interface unit capable of operating as a bus controller, a remote terminal, and a monitor. The bus interface unit is compatible with military standard buses and is controlled using an enhanced Atlas test programming language. Test instruments are provided on cards using a two-part architecture in which common test instruments are arranged as part of a core tester unit while application-specific enhanced are controlled by a separate microprocessor in a functional interface unit.

30 Claims, 5 Drawing Sheets

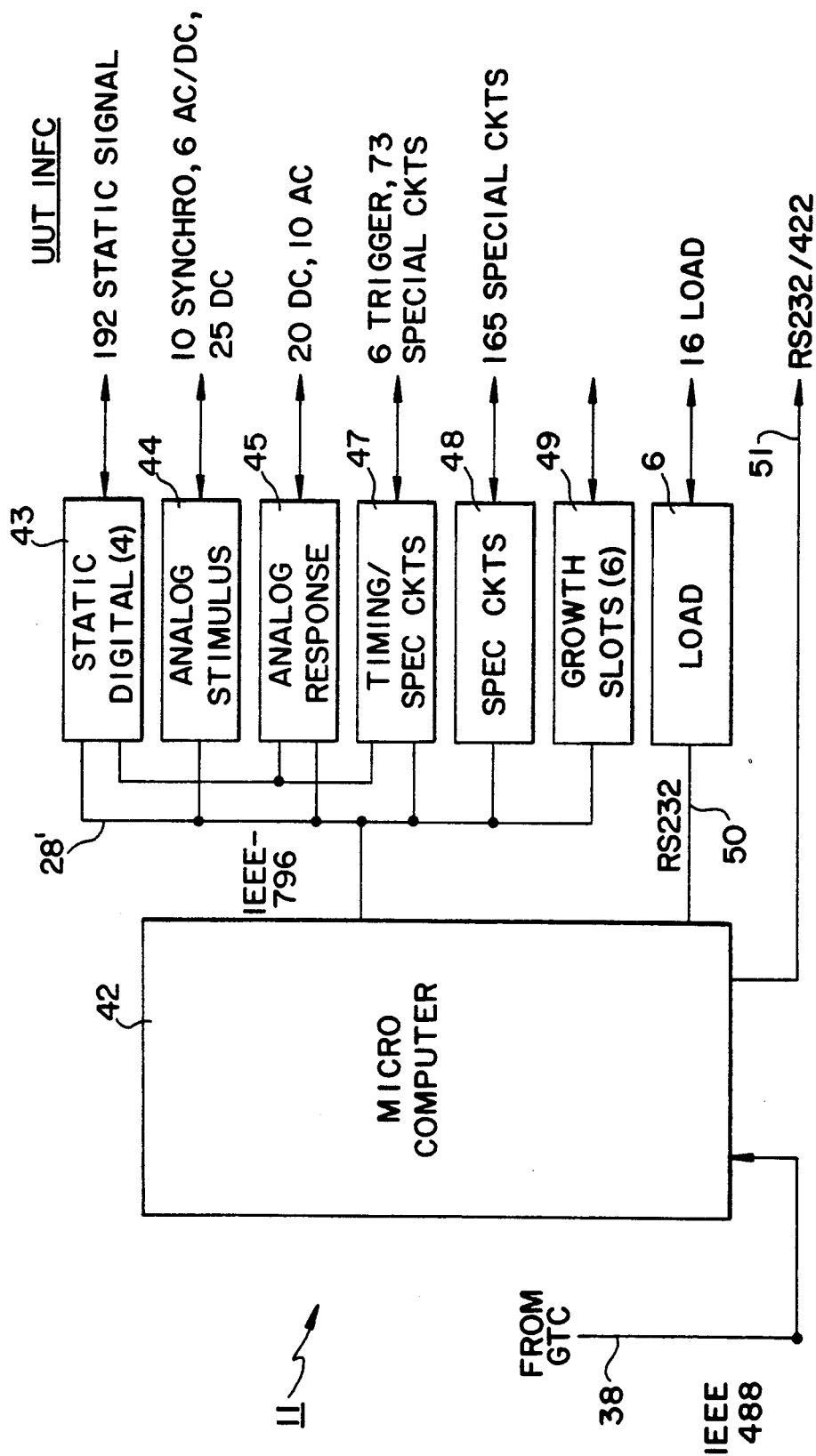

FUNCTIONAL AVIONIC CORE TESTER

BACKGROUND OF THE INVENTION

1. Field of the Invention

This invention relates to a tester for performing functional testing on electronic and electromechanical weapon systems, including avionics systems.

2. Description of Related Art

As high technology systems, such as avionics or weapon systems, become increasingly reliant upon sophisticated electronic or electromechanical components, the number and complexity of test procedures required to provide support for the systems also increases. Automated test equipment has been developed which enables an organization to achieve organic support of a system with relatively low-skill level personnel, but as the system becomes more complex, the conventional, sequential, parametric test programs used by automated test equipment tend to grow in length. The escalating costs of automatic test equipment and conventional test programs, coupled with test times measured in hours, has made this method of systems support increasingly less desirable in a variety of contexts.

An early system adopted for use in the context of avionics was the Versatile Avionics Shop Tester (VAST) developed to test avionics for aircraft built by Grumman Corporation. VAST was a complex and sophisticated system and the Navy's first attempt at a general-purpose test station. The physically large system consisted of nine racks filled with electronic instruments ranging from a digital subsystem to a cynchro-resolver standard. High power consumption and heat dissipation required the use of forced-air cooling.

Test program sets developed on VAST tended to have long run times and complex fault isolation paths. The programs often involved rigorous testing that, in hindsight, seems inappropriate for the application. Power supply outputs, for example, were often tested to extremely tight tolerances even for parameters such as long-term drift and AC ripple. The "unit under test" (UUT) parameters were frequently checked for accuracies to which they were designed, but beyond their functional use. Some of these tests were appropriate for an "acceptance" test procedure, in which a design is tested for specification adherence.

"Field" testing differs significantly from acceptance testing. Field problems are not likely to be slight losses of tolerances, but rather complete failures. Units removed from an aircraft for a power supply problem, for example, are far more likely to be due to complete loss of power supply output than to an output that exceeds 1% of nominal. Avionics units are removed from aircraft during organizational level maintenance because they have hard failures, or perhaps because they have intermittent failures, but not because they are merely operating outside of specification.

The type of testing in which a unit is tested to its design parameters is called "parametric" testing. Parametric testing is typified by a high degree of testing coverage, possibly excessive in some cases; by generally sequential application of stimuli and evaluation of responses; extensive fault isolation limited only be test connector access; and comparatively long test times.

Parametric testing can sometimes indicate a problem where no real problem exists. For example, a unit might be tested solely because it has just been received or taken out of inventory and the maintenance chief must determine if it is ready for issue. The UUT might fail the test program because an output is being tested to a tolerance beyond its functional use. While in the aircraft, the same unit would appear to be operational, and the onboard built-in test (BIT) would indicate no problem.

An unnecessary and undesirable conflict is created in this situation, in which the customer caught in the middle with either be suspicious of the unit or, more likely, lose confidence in the test program. In that case, the test program will fall into disuse, and the lack of confidence might spread to include other programs. Although such a scenario should not imply that a test program should be cursory or superficial, it does become clear that an intelligent compromise must be reached.

The concept of functional testing is a response to these testing enigmas. Functional tests check a UUT in accordance with its functional use, rather than to rigorous criteria to which the unit was designed and accepted. Functional tests are based on tolerances that provide satisfactory operation in an aircraft or other weapon system. Functional tests take significantly less time to run than parametric tests and make greater use of, and are more reliant on, a unit under test's internal-test circuitry and software. A functional confidence test of a UUT should take no more than half an hour to execute.

Units under test generally possess internal microprocessors that, when so instructed, run designed-in diagnostic BIT programs. The BIT hardware and software designed into a unit can be analyzed to determine which circuits are not checked by BIT so that supplemental testing can be added to the program as necessary.

The majority of new weapon systems have improved BIT programs and hardware, and are designed around a standard bus architecture. Conventional automatic test equipment hardware and test programs are not designed to take full advantage of the weapon system's improvements. Functional testing, on the other hand, provides a cost-effective means for support of modern electronic and electromechanical weapon systems. It is user-friendly, inexpensive, and requires minimal operator training and employs moderate-cost test programs that provide short test times. The tester must be capable of fault detection or fault isolation of either "black boxes" or electronic modules from a wide range of weapon systems.

Essentially, the difference between conventional testing and the proposed functional approach is that classic automatic testing performs fixed-sequence parametric tests requiring many high-precision instruments and long test times, while functioning testing employs variable-sequence functional test programs that take advantage of all available information including input/output activity, while running the BIT program of the UUT. This approach requires fewer high-precision instructions and shortens test times.

Recently, a high performance, relatively compact type of classic automatic test equipment known as the Screening or Small Computerized Automatic Tester (SCAT) has been develop which incorporates a number of hardware and software advances, although in the context of parametric rather than functional testing. Key features of SCAT are that it is contained within a package which is easily transportable and uses a number of innovative design concepts including smart switch routing via a high-performance backplane bus, test program storage using plug-in bubble memory cartridges, and high-performance instruments-on-a-card which are each compatible with the system backplane and whose configuration may therefore be varied simply by installing different cards for each type of system to be tested. The test programs stored in bubble memory use Department of Defense mandated standard test language IEEE-716 ATLAS (Atlas) and a mainframe compatible operating system. An example of a SCAT system is disclosed in U.S. Pat. No. 4,760,329, assigned to the present assignee, and incorporated herein by reference.

The heart of the SCAT system is the family of high performance instruments-on-a-card that plug into the industry standard IEEE-796 bus. The instruments-on-a-card may include a digital multimeter, a counter/timer, a function generator, and so forth. Each SCAT instrument is self-contained on a single plug-in card. This highly modular architecture offers several important advantages. The tester is easily customized to meet unique analog, digital, or hybrid requirements, and is easy to upgrade to meet next-generation test requirements by adding new instruments incorporating the latest technology available.

The present invention uses many of the advances embodied by SCAT, including the instruments-on-a-card concept and a high-performance backplane, bus-oriented architecture, but adapts the system for use as a function tester rather than as a parametric tester.

SUMMARY OF THE INVENTION

In view of the above discussion of the respective advantages and disadvantages of automatic test equipment in general and the recently developed SCAT system, it is an objective of the invention to provide an improved computerized tester similar to SCAT but adapted for implementing functional test procedures, thereby simplifying the test equipment and providing faster test programs.

It is a further objective of the invention to provide a functional tester, in particular for avionic applications, in which connection to the unit under test may be accomplished using standard cables and a bus interface unit capable of operating as both a bus controller, remote terminal, or monitor in order to maximize the number of different systems with which the interface unit is compatible, and at the same time to minimize the complexity of any enhancements necessary to adapt the tester to a specific system.

It is still further objective of the invention to provide a functional tester having an improved bus interface unit capable of operating as a bus controller, remote terminal, or monitor, which provides military standard bus test and analysis capability, and which utilizes an improved Atlas test language syntax for greater adaptability and ease of programming.

These objectives are accomplished by the inclusion in the preferred tester of a bus interface unit (BIU) compatible with the MIL-STD-1553 Aircraft Internal Time Division Command/Response Multiplex Data Bus, which is the most widely used data bus in modern weapons systems. The invention includes a BIU that provides MIL-STD-1553A and MIL-STD-1553B bus test and analysis capability, and which can operate as a bus controller, remote terminal, or monitor to achieve compatibility with a maximum number of different systems and built-in test programs. In addition, the preferred system advantageously uses a new Atlas standard test language syntax which allows the test programmer to control the BIU using simple English-language Atlas statements. Finally, the preferred BIU may advantageously be used without a separate panel interface to either the UUT or the touch panel display through which the tester is programmed.

These and other improvements will be described in more detail in connection with a specific embodiment of the invention especially suited for avionics testing, although it is to be understood that the invention is not limited to avionics systems testing.

In contrast to the SCAT tester philosophy of parametric testing, the functional tester of the preferred embodiment of the invention uses functional testing to isolate faults. The modifications, enhancements, and new designs which have been made to the instruments-on-a-card, software and packaging of the SCAT tester for the purpose of accomplishing functional testing will become apparent from the following description.

BRIEF DESCRIPTION OF THE DRAWINGS

FIG. 3 is a block diagram of a specially tailored functional interface unit (FIU) for use in conjunction with the preferred core tester as indicated in FIG. 1.

DETAILED DESCRIPTION OF THE PREFERRED EMBODIMENTS

Figure 1:
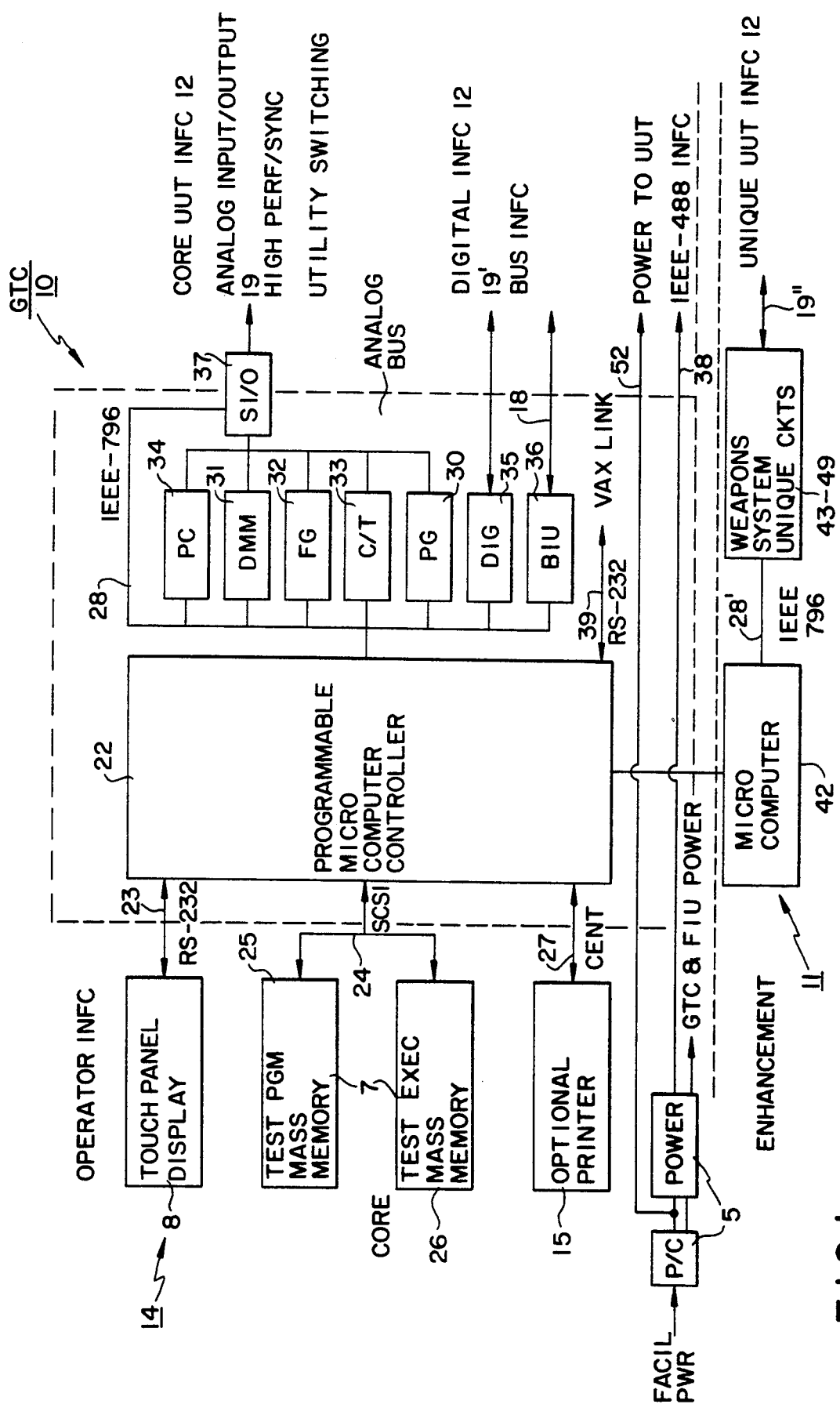
FIG. 1 is a block diagram of a functional tester according to a preferred embodiment of the invention, including a functional interface unit and a core tester made up of a generic test controller (GTC), an operator interface, and a UUT interface, the GTC includes a bus interface unit (BIU).

FIG. 1 is a block diagram of the overall arrangement for the functional avionic core tester (FACT) of the preferred embodiment. Although the preferred functional tester will be described in the context of an avionics tester, the invention is not intended to be limited to avionic or weapon systems, but rather is intended as a cost-effective means for supporting a wide variety of modern electronic and electromechanical systems.

The exemplary preferred system shown in FIG. 1 is a relatively compact functional tester for efficiently interfacing with a modern weapon system and, using functional test techniques, takes advantage of the weapon system's BIT circuitry and advanced architecture. It will be appreciated that the preferred functional tester may need to be specifically adapted for the particular weapon system to be tested, but that the invention provides an architecture and interface according to which adaptation will be easily accomplished by those skilled in the art.

Essentially, the present invention utilizes standard buses and a flexible control system for interrogating the weapon system or UUT and performing the various functional tests required using the weapon system's own BIT circuitry. The test routines and bus hardware required depend on the weapon system to be tested but, once the weapon system to be tested is known, adaptation of the preferred tester may easily be implemented by anyone skilled in the art.

Figure 2A:
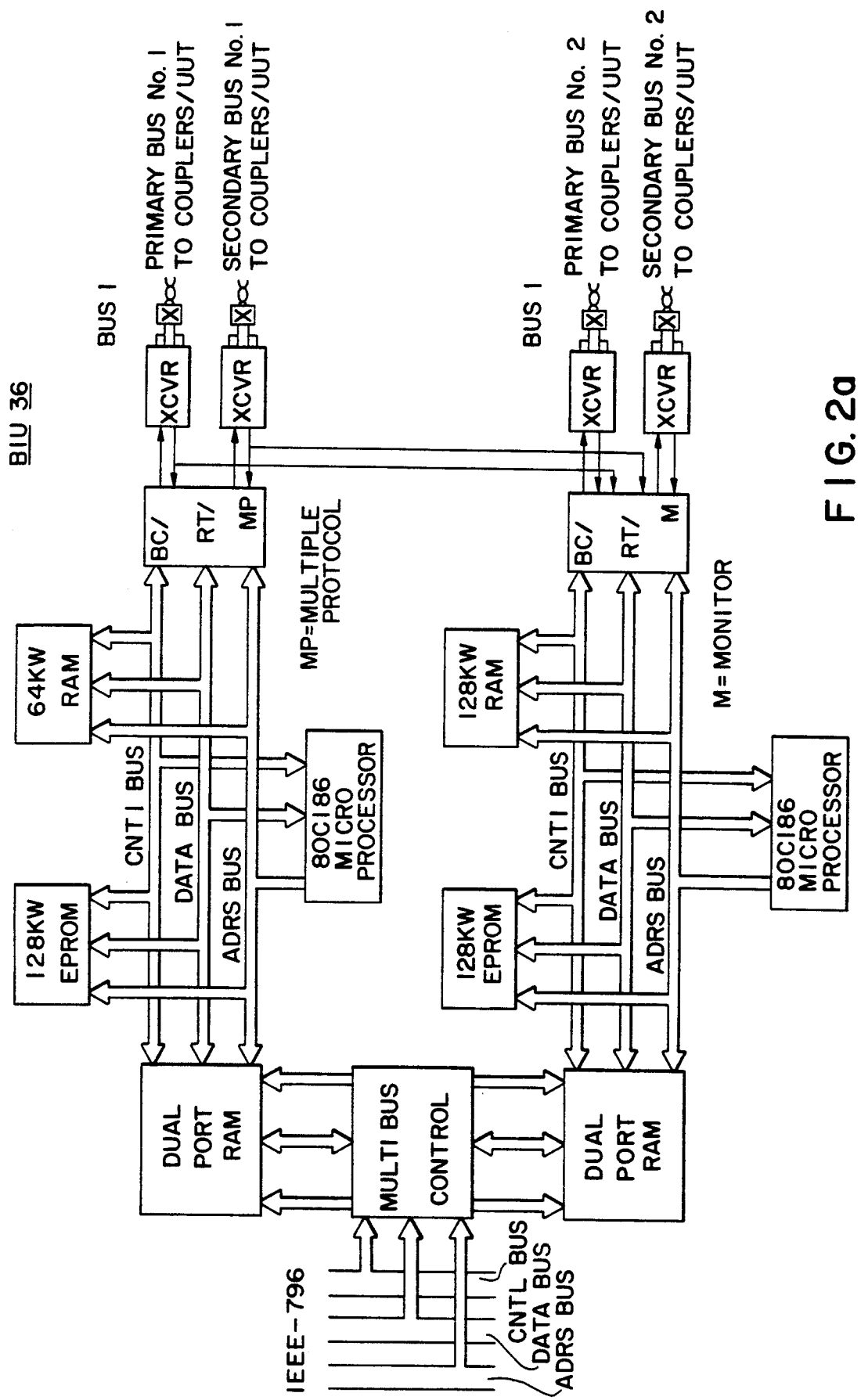
FIG. 2(a) is a block digram of a preferred bus interface unit for use in the functional core tester shown in FIG. 1.
Figure 4:
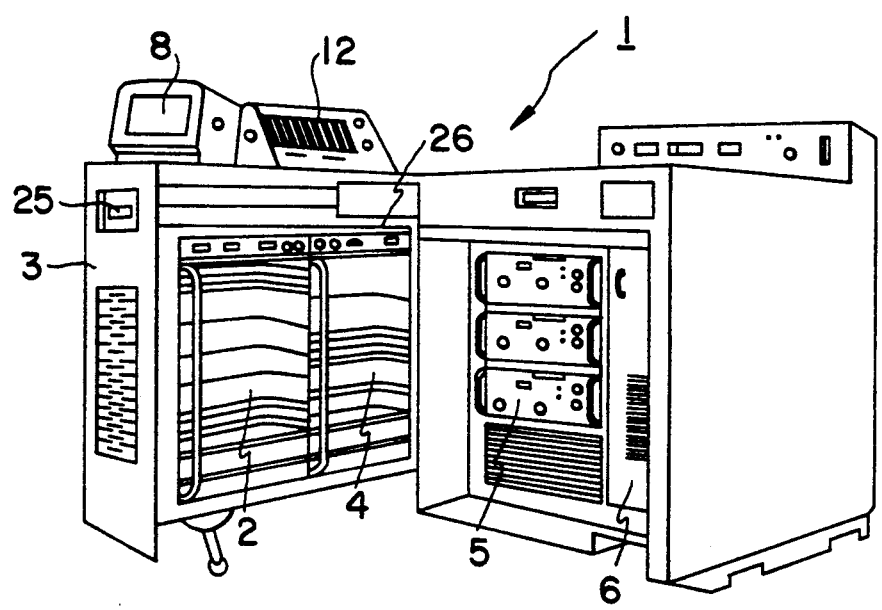
FIG. 4 is a schematic view of a test station which incorporates the functional tester of FIGS. 1-3.

As shown in FIG. 4, the functional tester is designed to be housed as a compact test station 1. The test station utilizes a modular design. The two bus interface units, shown in detail in FIG. 2(a), are advantageously provided on two cards inserted into slots in, for example, front bay 2 of a pullout pedestal drawer 3. The station also includes functional interface unit (FIU) card slots in bay 4 for receiving enhancement cards specific to the equipment being tested. Other portions of the test station house modular power supplies and precision DC sources 5 and programmable loads 6. Control programs including the routines for implementing the functional tests are preferably stored in cartridge memory units 7 such as those used in the SCAT system currently in use for weapons testing and described in U.S. Pat. No. 4,760,329. Finally, the test station preferably includes a touch panel display 8.

Although a specific stand-alone test station has been shown, it will be appreciated that a variety of housing configurations may be used with the circuitry of the invention. Thus, the invention is intended to encompass portable designs as well as fixed designs. An important feature of the test station 1 shown in FIG. 4 is that the connection hardware, including all necessary buses, are built into the station. In order to adapt the station for use with specific weapons designs, it is necessary only to replace or add enhancement cards in the two bays 2 and 4, utilizing the SCAT instrument-on-a-card concept together with a common BIU as described below.

Returning to FIG. 1, the system includes both the core tester (including generic test controller (GTC) 10, an operator interface 14, and the UUT interface) and an enhancement unit or functional interface unit (FIU) 11. The core tester provides basic stimulus and response capability, which satisfies many test requirements. Unique, application-specific requirements are satisfied by the enhancement unit 11, which contains relatively simple circuits uniquely suited to functional testing of a specific system.

Both the generic test controller (GTC) cards and functional interface unit (FIU) cards are connected by mass terminated cables 19 to the UUT interface panel 12. Additionally the BIU cards (part of the GTC) are connected to two dual redundant standard bus', such as the MIL-STD-1553 Aircraft Internal Time Division Command/Response Multiplex Data Bus, to the UUT interface panel. The only external hardware needed to make the connection between the Functional Avionic Core Tester and the UUT is a set of cables. A separate external interface device is therefore not required.

The GTC and the FIU communicate with each other via an IEEE-488 bus over an internal cable. The GTC is also connected to an operator interface 14 built into the station, including cartridge memory holders 7, touch panel display 8, and a printer 15 if desired.

The core tester of the preferred embodiment makes use of the SCAT concept of providing a card (or board) for each instrument. Each card plugs into an industry-standard IEEE 796 bus provided in the station backplane. Each instrument is self-contained on a single plug-in card and replaces a full drawer in a rack and stack system. However, according to the preferred embodiment of the invention, a major enhancement was made to enable the SCAT system to serve as a prototype for FACT. This enhancement was the addition of a highly capable weapon system bus interface.

The most widely used data bus in modern weapon systems is the MIL-STD 1553 Aircraft Internal Time Division Command/Response Multiplex Data Bus. The MIL-STD 1553 bus is presently used on Air Force, Navy, Army and Marine weapon systems. The bus interface unit 36 which is part of the GTC 10 of the invention provides both MIL-STD 1553A and MIL-STD 1553B bus test and analysis capability. The GTC contains two plug-in BIU cards providing a capability of two dual redundant buses, 18, 18', 18", and 18"' as indicated in FIG. 2(b).

Figure 2B:
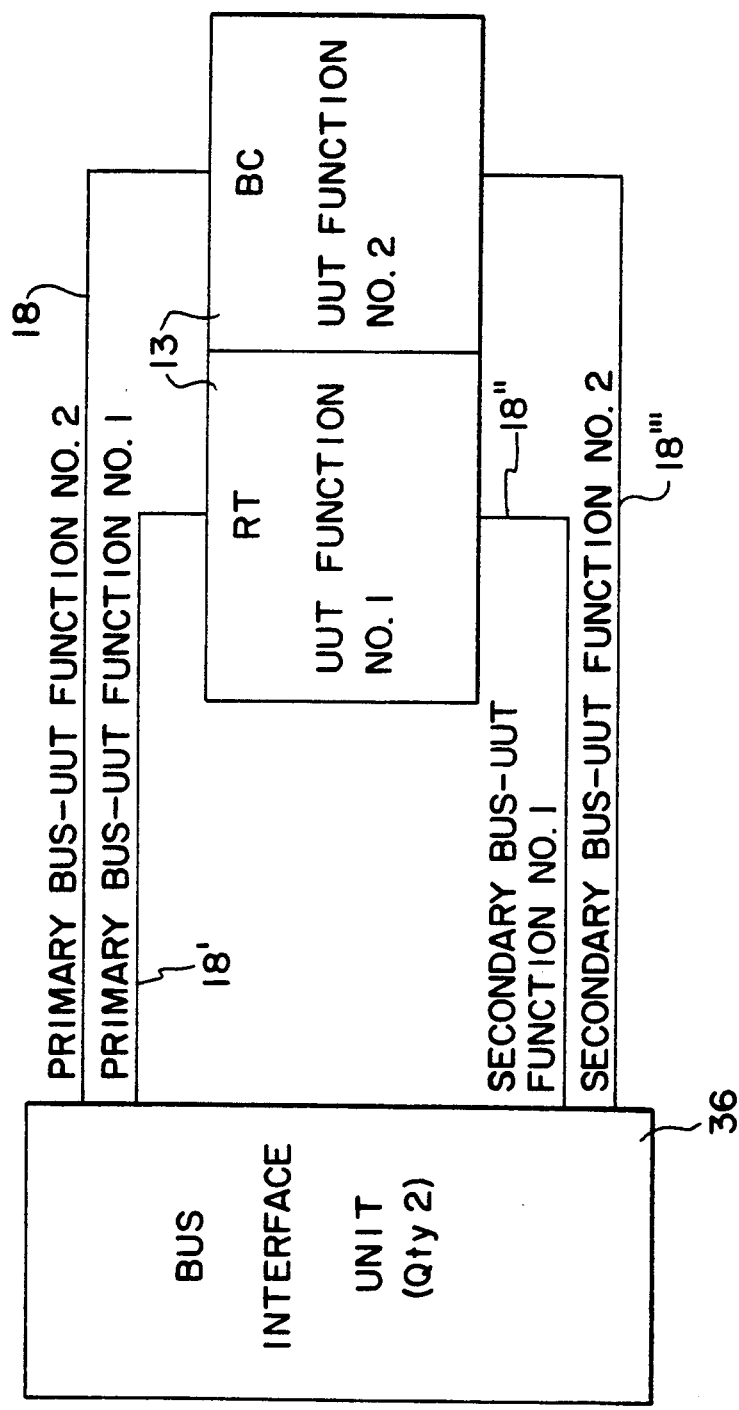
FIG. 2(b) is a functional block diagram showing an application of the preferred bus interface unit of FIG. 2(a).

A shown in the functional block diagram of FIG. 2(b), the BIU can operate as a bus controller (BC), remote terminal (RT), or monitor. Software provides test program control of the BIU 36 and performs analysis of captured data from the device under test 13.

As shown in FIG. 1, the preferred core tester includes a microcomputer controller 22 which utilizes an INTEL 80286 microprocessor. Touch panel display 8 communicates with the processor via a standard RS-232 link 23. The preferred mass storage device includes two plug-in cartridge memory units 7, although numerous other memory units, including tape drives and optical or magnetic discs, may be substituted. One cartridge memory 26 is used for the operating system and test executive programs and a second cartridge memory 25 is reserved for the functional test programs. Both cartridge memory units interface to the main processor via a standard Small Computer System Interface (SCSI) link 24. In addition, a Centronics parallel interface 27 or a similar interface is provided for the optional printer 15 and a power cable 52 to the UUT is also provided.

The programmable microcomputer controller 22 interfaces with a variety of basic board-mounted test instruments via an IEEE-796 bus 28. GTC 10 includes two pulse generators 30, a digital multimeter 31, a function generator 32, a counter/timer 33, a power control board 34 for programming digital pin logic levels, a digital interface 35 including dynamic digital interface pins and clock/control pins,' and two bus interface units 36 providing two dual redundant MIL-STD 1553 bus interface channels. Bus interface 36 may take the form of the interface unit described in U.S. Pat. No. 4,453,229, incorporated herein by reference.

The internal interface for these instruments to the UUT is via an internal switching matrix and universal pins provided on the plug-in switching input/output card (SI/O) 37. Any of the internal switching matrix input output pins at the UUT interface can be connected to anyone of the analog instruments through the internal switching matrix such as the ones described in U.S. Pat. Nos. 4,719,459 and 4,763,124 incorporated herein by reference. The GTC also includes an internal IEEE-488 bus interface 38 for carrying data. The power/control board 34 provides a precision DC voltage source and programmable voltages to the digital instrument 35 that allows logic levels of the digital pins to be programmed in groups of 24. In addition, an RS-232 link 39 to a VAX or similar mini or mainframe computer may also be provided.

Those skilled in the art will appreciate that the specific arrangement of instruments listed above are subject to numerous modifications. The list of instruments is intended to illustrate a specific embodiment of the invention, but the invention itself is not intended to be limited to the use of any particular instruments, but rather encompasses the broad concept of providing a core tester, including a variety of instruments, having the widest possible application to simplify adaptation for testing specific weapon systems. Furthermore, those skilled in the art will appreciate that each instrument may take a variety of forms. Examples of suitable instruments include those disclosed in U.S. Pat. Nos. 4,316,259; 4,066,882; 4,507,740; 4,799,220; 4,791,312; and 4,792,951, all assigned to Grumman Aerospace Corporation and incorporated herein by reference.

Each of the instruments listed above is an electronic instrument which may be used in a wide variety of test procedures under the control of processor 22 and the test program stored in cartridge memory 25. On the other hand, the enhancement or functional interface unit (FIU) 11 shown in FIG. 1 is designed to complement the core tester while including specific instruments designed for specific applications. The core tester therefore will be used with a wide variety of units under test, while FIU 11 is specific to a particular type of unit under test. Together, the core tester and FIU 11 form a novel architecture especially suited for functional testing.

An example of such a specific FIU for use in conjunction with the core tester is shown in FIG. 3. This interface is shown by way of example only, the list of instruments used therein being dictated by the requirements of the unit under test. The configuration shown in FIG. 3 has been tailored to meet the requirements of the F-14 fighter aircraft weapon replaceable assemblies (WRA's). Other units under test would be accommodated by different interface unit suites.

Functional interface unit 11 includes a static digital interface 43 with 192 pins, each of which can be programmed as either a driver as a receiver, an analog stimulus 44 including 3-wire synchro/resolver outputs and AC/DC stimulus outputs which can be programmed to a +/−voltage peak, an analog response 45 including DC input channels for DC response measurement, each of which can be independently programmed, and AC input channels for AC response measurement, each of which can also be independently programmed. The FIU also includes special timing circuits 47 required by the F-14 WRA, functional loads 6, and special digital interface 48 which can transmit and receive data simultaneously and can transfer data at various selectable rates, leaving six extra slots in bay 4 of test station 1. Unit 11 uses an IEEE-796 backplane bus 28' similar to bus 28 in bay 2 for internal communications between the instruments and a microcomputer containing an INTEL 80286 microprocessor 42. In addition, and an RS-232 interface 50 to loads 6, and an RS-232 interface 52 to the UUT.

The test programs stored in cartridge memory unit 25 are preferably written in the high level test language IEEE-716 Atlas. Programs can be edited and compiled on station via an RS-232 link to a mini or mainframe computer. The Atlas compiler functions as an in line interpretive system with built-in edit and file management capabilities. Atlas source statements are entered into the system and compiled to produce an Atlas source image file and an executable interpretive code file. When an Atlas statement is edited, both the source and IC images are automatically and concurrently updated in a single operation which is transparent to the user.

In order to allow the test programmer to control the BIU with a minimum of training, a new Atlas syntax has been developed. The BIU provides the proper electrical interface for functional testing of units under test that require connection via the MIL-STD-1553 bus. Two independent dual redundant cards are available. Each card may be independently programmed using the modified Atlas syntax as either a bus controller to control the data exchange between the tester and the unit under test or as a remote terminal in which bus traffic is controlled by the unit under test, or as a monitor.

An example of a test program for operating the BIU in a bus controller mode is shown in Appendix I. The BEGIN statement of line 000001 sets the bus interface unit in bus controller or "master" mode. The REQUIRE statement of line 000010 is then used to establish and label a summary of the characteristics needed by a test resource. Subsequent reference to the test resources is made via the label, in this case "BIU1", that appears in the REQUIRE statement. A separate REQUIRE statement is required for each bus interface unit in the test station. The parameters for the various variables are sent via the DECLARE statements in lines 000020–000028.

The FILL statement in line 000030 sets up a data list DATLST, which includes the commands and data that the bus interface unit will be sending out, in the order that they will be sent out. Each entry in the data and response variable list corresponds to a single word. The number of messages transmitted must equal the number of messages received, assuming no failures, but the number of words transmitted need not be equal to the number of words received.

The FILL statement is also used in line 000032 to set up a gap list GAPLST, which gives the predetermined delays between data communications for each step of the test program. Finally, in step 100,000, the SETUP statement documents the operating parameters of the BIU.

The next section of the program directs the communications between the bus interface unit and the unit under test. The CONNECT statement in line 100,100 connects the BIU data bus signals to the specified pins via the station MIL-STD-1553 data bus coupler and resets the connected channel to a quiescent state. The words PULSED DC USING are part of the general format of the statement, which is followed by the label, in this case BIU1. The letters XB1 and XB-1 in the example are particular pin numbers.

The actual communication is accomplished via the DO,EXCHANGE statement in the line 100200, which is part of the IEEE standard Atlas syntax, described in IEEE standard 716-1989, section 13.3. The DO,EXCHANGE statement describes sequencing of exchanges which define the overall bus traffic of interest to the test being performed. It also specifies the test equipment participation in each exchange. In particular, the DO,EXCHANGE statement, in effect, establishes the concurrent execution of various bus related operations, and prioritizes operations. The execution of a DO, EXCHANGE statement continues until the termination of every operation or of the MAX-TIME FIELD whichever occurs first. Unlike the DO, EXCHANGE statement as described in the example given in connection with the IEEE standard specification, however, the DO, EXCHANGE statement as used in the preferred test program utilizes the data and gap list set up by the FILL statement.

Upon receipt of data, the data is stored in a buffer and retrieved by the READ statements in lines 100300, 100330, and 100360. A status bit returned by the unit under test into the STATUS INTO variable in response to the READ, STATUS statement contains, by way of example, the following information: Bit 0 indicates that the receiver input buffer has overflowed. Bit 1 indicates a message error. Bit 2 indicates that the actual command is not equal to the expected command, and is used only in the SLAVE or remote terminal mode, in which the bus interface unit receives commands from the unit under test and is controlled thereby. Bit 5 indicates that a response message has not been received in a predetermined time interval set by the RESP time variable when the bus interface unit is in MASTER mode. Bit 6 indicates that a channel is not operational due to hardware failure, and Bit 7 indicates that the channel is still busy processing data. Bit 8 indicates that MAX-TIME has expired when the bus interface is in SLAVE mode. Finally, Bit 9 indicates that a valid response has been received over the MIL-STD 1553 bus. It will be appreciated that the WHILE statement used in connection with the READ statement in lines 100320–100340 is a standard Atlas command for setting up a loop between WHILE and END.

In its bus controller mode, using the above commands and the program shown in Appendix I, the BIU functions as follow:

Initially, a command and associated data words are transmitted from the data list elements. The interface unit then waits a predetermined time, RESP-TIME, for a response from the unit under test which will be stored in a response buffer element. If no message is received within the predetermined time (12 microseconds in the example of Appendix A), then the response time error bit 5 is set in the BIU status word and an error routine is implemented. The delay for the gap time between messages is specified in the associated element of the gap-time list. For each message entry in the data list there is a corresponding entry in the gap-time list.

The next command word from the data list is then transmitted. The system again waits a predetermined time for a response from the unit under test which is stored in the response buffer elements. If no message is received within the predetermined response time, then the response time error bit is set in the BIU status word, and the control program returns to step 1. The system then specifies a delay for the gap time in the associated element of the gap-time list.

This sequence is repeated for the next command word from the data list element, the response being stored another response buffer element 4. If the gap-time entry for the last message is non-zero, then the system delays for the specified gap time and goes to step 1. If the gap-time is zero, then the response data valid bit is immediately sent to the BIU status word. If the above sequence cannot be completed, the appropriate bit will be set in the BIU status word to indicate that the exchange did not complete. The Atlas programmer must execute a read, status statement to retrieve the BIU status word and the response buffer.

A control program for operating the bus interface unit in remote terminal mode is shown in Appendix II. In remote terminal mode, the format of the data list is the commands the BIU expects to see, along with the status and data words it will respond with. The commands must be in the order they are expected, out of order commands will be flagged as an error. If the command word is a 1553 "receive" command, or a mode code with data and with a T/R bit reset, data words are not included in the list. The commands are the same as described above in connection with Appendix I, except that the mode is set by the programmer to SLAVE rather than MASTER.

As a remote terminal, the BIU functions as follows:

The interface unit waits for a message from the unit under test and stores it in the response buffer. It then waits a number of seconds specified by the RESP-DELAY command and transmits a 1553 status word and data, if required, from the data list. When there are not data messages left in the data list, the control program returns to step 000001. Otherwise, it sets the appropriate bits in the BIU status word. If the above sequence cannot be completed within a specified MAX-TIME counter, then the current partial data and status is returned with bit 8 of the status word set to indicate that the exchange did not complete within the MAX-TIME time period programmed. The Atlas programmer must execute a read, status instruction to receive the BIU status word and the response buffer.

The "keep alive" situation shown in Appendix III provides an especially advantageous modification of the IEEE-STD-716-1989 Atlas programming language for the BIU. In the "keep alive" mode, a sequence of messages is sent out to the unit under test every few milliseconds. Without the "keep alive" sequence of messages, many of the new WRA's assume that a system fault exists and automatically change their mode of operation, making it impossible to continue testing. The "keep alive" mode of operation is similar to the operation of the regular bus controller mode in that the "keep alive" messages are contained in DATLST and the intermessage times are specified in GAPLST. However, when a specific status word, REF STATUS 'VALUE ', is sent by the unit under test, the BIU recognizes the status word and begins executing another sequence of messages within a predetermined amount of time, BLOCK-GAP-TIME. This second sequence of messages is contained in a second data list DATA2 (line 100200). The intermessage times are specified in the GAP-TIME 2 list. The Atlas programmer executes READ, STATUS instructions to retrieve the BIU status word and the two response buffers. The REMOVE instruction is used to terminate the loop.

In practice, the Atlas syntax described above would, of course, also include edit and debug command features, and other conventional programming aids. In addition, various templates and menu drivers would preferably be included to further simplify operation of the interface unit. It is intended that all such additional variations in both the BIU hardware and software be considered to be within the scope of the invention. Therefore, having described in detail single exemplary preferred embodiment of the invention, it will nevertheless be appreciated by those skilled in the art that the invention should not be limited to the embodiment described above, but rather should be limited solely by the appended claims.

APPENDIX I

MASTER PROGRAMMING EXAMPLE

```
000001 BEGIN,ATLAS PROGRAM 'MASTRBIU'  $
000010 REQUIRE,'BIU1',STIM-RESP,EXCHANGE,CAPABILITY,
       TEST-MODE,MASTER  $
000020 DECLARE, INTEGER, LIST, 'GAPLST'(4)  $
000022 DECLARE, DIGITAL, LIST, 'DATLST'(8), 16 BITS  $
000023 DECLARE, DIGITAL, LIST, 'RSP'(20), 16 BITS  $
000024 DECLARE, DIGITAL, STORE, 'STAT', 16 BITS  $
000025 DECLARE, INTEGER, STORE, 'STAT1'  $
000026 DECLARE, MSGCHAR, STORE, 'KEY', 1 CHAR  $
000028 DECLARE, INTEGER, STORE, 'LEN'  $
000030 FILL, 'DATLST'(1 THRU 8),X'3C23',X'3822',X'0101',X'BBBB',
       X'3C28',X'3822',X'AAAA',X'5555'  $
000032 FILL, 'GAPLST'(1 THRU 4),200,200,1030,0  $
100000 SETUP,EXCHANGE USING 'BIU1',
       TRANSMIT VOLTAGE-ONE 2.5V,TRANSMIT VOLTAGE-ZERO -2.5V,
       RECEIVE VOLTAGE-ONE +0.5V,RECEIVE VOLTAGE-ZERO -0.5V,
       PULSE CLASS BIP,PARITY P0,WORD-LENGTH 16  $
100100 CONNECT,PULSED DC USING 'BIU1',CNX TRUE XB1 COMPL XB-1  $
100200 DO,(STATUS INTO 'STAT'),
       EXCHANGE USING 'BIU1',TEST-MODE,
       MASTER,
       DATA 'DATLST'(1 THRU 8),
       GAP-TIME 'GAPLST'(1 THRU 4),
       RESP-TIME 0.000012 SEC  $
100300 READ,(STATUS INTO 'STAT1'),EXCHANGE USING 'BIU1',
       RESP 'RSP'(1 THRU 20)  $
100320 WHILE, 'STAT1' EQ 128, THEN  $
100330 READ,(STATUS INTO 'STAT1'),EXCHANGE USING 'BIU1'
       RESP 'RSP'(1 THRU 20)  $
100340 END,WHILE  $
100360 READ,(EXCHANGE-LENGTH INTO 'LEN'),EXCHANGE USING 'BIU1'  $
100370 OUTPUT, ('STAT1')  $
100400 OUTPUT, ('RSP'(1 THRU 'LEN'))  $
100420 DELAY, 5 SEC  $
100440 OUTPUT, TYPE A "G" TO CONTINUE  $
100460 INPUT, GO-NOGO  $
100600 REMOVE,PULSED DC USING 'BIU1'  $
100999 TERMINATE, ATLAS PROGRAM 'MASTRBIU'  $
```

APPENDIX II

SLAVE PROGRAMMING EXAMPLE

```
000001 BEGIN,ATLAS PROGRAM 'SLAVEBIU' $
000010 REQUIRE,'BIU,STIM-RESP,EXCHANGE,CAPABILITY,
       TEST-MODE, SLAVE $
000022 DECLARE, DIGITAL, LIST, 'DATLST'(27), 16 BITS $
000023 DECLARE, DIGITAL, LIST, 'RSP'(40), 16 BITS $
000024 DECLARE, DIGITAL, STORE, 'STAT', 16 BITS $
000025 DECLARE, INTEGER, STORE, 'STAT1' $
000028 DECLARE, INTEGER, STORE, 'LEN' $
000030 FILL, 'DATLST'(1 THRU 27),X'082A',X'0800',X'086F',X,0800',
       X'0C85',X'0800',X'0000',X'1111',X'2222',X'3333',X'4444',
       X'0C82',X'0800',X'AAAA',X'8888',X'0822',X'0800',X'0C43',
       X'0800',X'0000',X'1111',X'2222',X'0C83',X'0800',X'FFFF',
       X'EEEE',X'DDDD' $
100000 SETUP,EXCHANGE USING 'BIU1',
       TRANSMIT VOLTAGE-ONE 2.5V,TRANSMIT VOLTAGE-ZERO -2.5V,
       RECEIVE VOLTAGE-ONE +0.5V,RECEIVE VOLTAGE-ZERO -0.5V,
       PULSE CLASS BIP,PARITY PO,WORD-LENGTH 16 $
100100 CONNECT,PULSED DC USING 'BIU1',CNX TRUE XB1 COMPL XB-1 $
100200 DO,(STATUS INTO 'STAT'),
       EXCHANGE USING 'BIU1',TEST-MODE,
       SLAVE,
       DATA 'DATLST'(1 THRU 27),
       RESP-DELAY 0.000010 SEC, MAX-TIME 30000 $
100300 READ,(STATUS INTO 'STAT1'),EXCHANGE USING 'BIU1',
       RESP 'RSP'(1 THRU 40) $
100320 WHILE, 'STAT1' EQ 128, THEN $
100330 READ,(STATUS INTO 'STAT1'),EXCHANGE USING 'BIU1',
       RESP 'RSP'(1 THRU 40) $
100340 END,WHILE $
100360 READ,(EXCHANGE-LENGTH INTO 'LEN'),EXCHANGE USING 'BIU1' $
100370 OUTPUT, ('STAT1') $
100400 OUTPUT, ('RSP'(1 THRU 'LEN')) $
100420 DELAY, 5 SEC $
100440 OUTPUT, TYPE A "G" TO CONTINUE $
100460 INPUT, GO-NOGO $
100600 REMOVE,PULSED DC USING 'BIU1' $
100999 TERMINATE, ATLAS PROGRAM 'SLAVEBIU' $
```

APPENDIX III

KEEP ALIVE PROGRAMMING EXAMPLE

```
000001 BEGIN,ATLAS PROGRAM 'KEEPALIV'  $
000010 REQUIRE,'BIU1',STIM-RESP,EXCHANGE,CAPABILITY,
       TEST-MODE, MASTER  $
000015 DECLARE, DIGITAL, LIST, 'DAT1'(3), 16 BITS  $
000016 DECLARE, INTEGER, LIST, 'GAP1'(1)  $
000018 DECLARE, INTEGER, STORE, 'BLOC'  $
000020 DECLARE, INTEGER, LIST, 'GAPLST'(4)  $
000022 DECLARE, DIGITAL, LIST, 'DATLST'(8), 16 BITS  $
000023 DECLARE, DIGITAL, LIST, 'RSP'(20), 16 BITS  $
000024 DECLARE, DIGITAL, STORE, 'STAT', 16 BITS  $
000025 DECLARE, INTEGER, STORE, 'STAT1'  $
000028 DECLARE, INTEGER, STORE, 'LEN'  $
000029 DECLARE, DIGITAL, STORE, 'SVCRQST', 16 BITS  $
000030 FILL, 'DATLST'(1 THRU 8),X'3C23',X'3822',X'0101',X'BBBB',
       X'3C28',X'3822',X'AAAA',X'5555'  $
000032 FILL, 'GAPLST'(1 THRU 4),200,200,1030,0  $
000040 FILL, 'DAT1'(1 THRU 3), X'3822',X'FFFF',X'0000'  $
000042 FILL, 'GAP1'(1),1000  $
000044 FILL, 'BLOC',1000  $
C099999 ****** BEGIN TESTING ******  $
100000 SETUP,EXCHANGE USING 'BIU1',
       TRANSMIT VOLTAGE-ONE 2.5V,TRANSMIT VOLTAGE-ZERO -2.5V,
       RECEIVE VOLTAGE-ONE +0.5V,RECEIVE VOLTAGE-ZERO -0.5V,
       PULSE CLASS BIP,PARITY PO,WORD-LENGTH 16  $
100100 CONNECT,PULSED DC USING 'BIU1',CNX TRUE XB1 COMPL XB-1  $
100200 DO,(STATUS INTO 'STAT'),
       EXCHANGE USING 'BIU1',TEST-MODE,
       MASTER,
       DATA 'DAT1'(1 THRU 3),
       GAP-TIME 'GAP1'(1),
       UNTIL REF-STATUS 'SVCRQST',
       BLOCK-GAP-TIME 'BLOC',
       DATA2 'DATLST'(1 THRU 8),
       GAT-TIME2 'GAPLST'(1 THRU 4),
       RESP-TIME 0.000012 SEC  $
100300 READ,(STATUS INTO 'STAT1'),EXCHANGE USING 'BIU1',
       RESP 'RSP'(1 THRU 20)  $
100320 WHILE, 'STAT1' EQ 128, THEN  $
100330 READ,(STATUS INTO 'STAT1'),EXCHANGE USING 'BIU1',
       RESP 'RSP'(1 THRU 20)  $
100340 END,WHILE  $
100360 READ,(EXCHANGE-LENGTH INTO 'LEN'),EXCHANGE USING 'BIU1'  $
100370 OUTPUT, ('STAT1')  $
100400 OUTPUT, ('RSP'(1 THRU 'LEN'))  $
100420 DELAY, 5 SEC  $
100440 OUTPUT, TYPE A "G" TO CONTINUE  $
100460 INPUT, GO-NOGO  $
100600 REMOVE,PULSED DC USING 'BIU1'  $
100999 TERMINATE, ATLAS PROGRAM 'KEEPALIV'  $
```

We claim:

1. Apparatus including a core tester and a functional interface unit for testing an electronic or electromechanical unit under test, wherein said core tester comprises:
   a programmable microcomputer controller (22);
   a plurality of test instruments;
   a programmable bus interface unit;
   first bus means including a first bus for connecting said test instruments to said bus interface unit and said programmable microcomputer controller;
   second bus means including a second bus for connecting said bus interface unit to a unit under test;
   means for programming causing said programmable microcomputer controller to program said bus interface unit to operate as a bus controller, as a remote terminal for receiving and transmitting bus traffic under the direction of said unit under test, and as a monitor, and means for programming the programmable microcomputer controller to direct traffic between said test instruments and said unit under test.

2. A method as claimed in claim 1, wherein said programming means comprises keep alive means for programming said bus interface unit to send a sequence of messages over said second bus to said unit under test every few milliseconds.

3. Apparatus as claimed in claim 1, wherein said second bus is a MIL-STD-1553A Aircraft Internal Time Division Command/Response Multiplex Data Bus.

4. Apparatus as claimed in claim 1, wherein said second bus is a MIL-STD-1553B Aircraft Internal Time Division Command/Response Multiplex Data Bus.

5. Apparatus as claimed in claim 1, wherein said programming means includes means for interpreting an Atlas language test program.

6. Apparatus as claimed in claim 1, wherein said bus interface unit comprises two cards to which the second bus is directly connected, whereby a separate panel interface is not required.

7. Apparatus as claimed in claim 1, wherein said programming means comprises a touch panel display.

8. Apparatus as claimed in claim 1, wherein said touch panel display is directly connected to said programmable microcomputer controller by an RS-232 link.

9. Apparatus as claimed in claim 1, wherein said programming means comprises means including cartridge bubble memory units for storing test programs.

10. Apparatus as claimed in claim 1, wherein each of two separate said bus interface units is provided on a single card.

11. Apparatus as claimed in claim 1, wherein said apparatus comprises a modular station in which said instruments, said bus interface unit, and said programmable microcomputer controller are mounted on removable cards installed in said station and wherein all connection hardware, including all buses, is built into the station.

12. Apparatus as claimed in claim 11, wherein each of said instruments is mounted on a separate card.

13. Apparatus as claimed in claim 12, wherein said first bus is an IEEE-796 bus provided in the station backplane.

14. Apparatus as claimed in claim 1, wherein said programmable microcomputer controller includes a microprocessor.

15. Apparatus as claimed in claim 14, wherein said microprocessor is an INTEL 80286 microprocessor.

16. Apparatus as claimed in claim 1, wherein said instruments comprise at least one pulse generator, a digital multimeter, a function generator, a counter/timer, and means including a power control board for programming digital pin logic levels, and wherein said programmable microcomputer controller is directly connected by said first bus to each of said instruments.

17. Apparatus as claimed in claim 16 wherein said a functional interface unit includes test equipment specific to said unit under test.

18. Apparatus as claimed in claim 17, wherein said programmable microcomputer controller comprises a first microprocessor and said functional interface unit comprises a second microprocessor.

19. Apparatus as claimed in claim 18, wherein said first and second microprocessors are connected to each other by an IEEE-488 bus.

20. Apparatus as claimed in claim 18, wherein said test equipment is connected to said second microprocessor by a IEEE-796 bus built into a test station backplane.

21. Apparatus as claimed in claim 17, wherein said core tester is connected to said unit under test by a MIL-STD-1553A bus.

22. Apparatus as claimed in claim 17, wherein said core tester is connected to said unit under test by a MIL-STD-1553B bus.

23. Apparatus as claimed in claim 1, further comprising a functional interface unit comprising test equipment specific to said unit under test.

24. Apparatus as claimed in claim 23, wherein said programmable microcomputer controller comprises a first microprocessor and said functional interface unit comprises a second microprocessor.

25. Apparatus as claimed in claim 1, wherein said core tester includes two independently programmable dual redundant interface cards.

26. A method of functionally testing an electronic or electromechanical unit under test, comprising the steps of:
   (a) providing a plurality of test instruments;
   (b) providing a programmable bus interface unit and a programmable microcomputer controller;
   (c) providing first bus means including a first bus for connecting said test instruments to said programmable microcomputer controller;
   (d) providing second bus means including a second bus for connecting said bus interface unit to a unit under test; and
   (e) programming said bus interface unit to operate as a bus controller as defined by MIL-STD-1553, as a remote terminal for receiving and transmitting bus traffic under the direction of said unit under test as defined by MIL-STD-1553, and as a monitor.

27. A method as claimed in claim 26, wherein step (e) comprises the step of programming said bus interface unit using an Atlas test programming language.

28. A method as claimed in claim 26, wherein step (e) comprises the step of setting up a data list including commands and data to be transmitted by the bus interface unit in the order that they will be sent out, completing a communication with the unit under test by transmitting said data and commands to the unit under test and receiving and storing responses from the unit under test in a buffer, and reading said responses and a status bit indicative of the status of said communication.

29. A method as claimed in claim 28, wherein step (e) further comprises the step of setting up a gap time list containing a list of predetermined time intervals between transmissions of data and commands.

30. A method as claimed in claim 26, further comprising the step of programming said bus interface unit to operate in a keep alive mode which sends a sequence of messages over said second bus to said unit under test every few milliseconds to maintain the UUT in a desired operating mode.

* * * * *